United States Patent [19]

Horigan

[11] Patent Number: 4,902,978
[45] Date of Patent: Feb. 20, 1990

[54] OPTO-ISOLATION SYSTEM AND METHOD OF USE

[75] Inventor: Walter L. Horigan, Huntingdon Valley, Pa.

[73] Assignee: Wolf Technologies Corporation, Philadelphia, Pa.

[21] Appl. No.: 295,089

[22] Filed: Jan. 9, 1989

[51] Int. Cl.[4] ............................................. G01R 31/00
[52] U.S. Cl. .................................. 324/556; 250/551; 324/72
[58] Field of Search .................. 324/556, 72–72.5, 324/133, 96, 557; 250/551

[56] References Cited

U.S. PATENT DOCUMENTS

| | | | |
|---|---|---|---|
| 3,141,131 | 7/1964 | McCoy | 324/96 |
| 3,283,157 | 11/1966 | Blackmer | 250/551 |
| 3,385,970 | 5/1968 | Coffin, Jr. et al. | 250/551 |
| 3,792,284 | 2/1974 | Kaelin | 250/551 |
| 3,878,397 | 4/1975 | Robb et al. | 250/551 |
| 3,991,367 | 11/1976 | Chapman et al. | 324/133 |
| 4,015,201 | 3/1977 | Chaffee | 324/51 |
| 4,032,843 | 6/1977 | Loucks | 324/96 |
| 4,188,574 | 2/1980 | Allington | 324/51 |
| 4,247,790 | 1/1981 | Sahasratbudhe et al. | 250/551 X |

Primary Examiner—Reinhard J. Eisenzopf
Assistant Examiner—Robert W. Mueller
Attorney, Agent, or Firm—Caesar, Rivise, Bernstein, Cohen & Pokotilow

[57] ABSTRACT

A method and apparatus, including an opto-isolation coupler, for monitoring an electrical parameter of a high voltage circuit. The apparatus comprises monitoring circuitry, a pair of input conductors, and the opto-isolation coupler. The input conductors are coupled to the high voltage circuit. The coupler comprises a holder and a Neon or other glow tube located therein for producing light upon the passage very little electrical current, e.g., in the microamp range, therethrough. The coupler includes a very high resistivity resistor coupled to the input conductors for providing the very low current to the Neon tube, and a phototransistor located within the holder and coupled to the monitoring circuitry to provide an electrical signal in response to the receipt of light from the Neon tube. The holder is a tubular member having a glass barrier wall separating the Neon tube and phototransistor and is encapsulated in a light-tight structure to prevent ambient light from reaching the phototransistor.

19 Claims, 2 Drawing Sheets

OPTO-ISOLATION SYSTEM AND METHOD OF USE

BACKGROUND OF THE INVENTION

This invention relates generally to devices for use with electrical monitoring systems, and more particularly to opto-isolation couplers for use therein and methods of such use.

As will be appreciated by those skilled in the art it is a common practice to utilize opto-isolation devices (also commonly referred to as optically coupled isolators) in electrical circuits to enable the monitoring of an electrical parameter of one circuit (or portion of a circuit) by another circuit (or portion of a circuit) while providing that the two circuits (or portions) are electrically isolated from each other. Thus, conventional opto-isolators effect such action by converting the electrical signal (.parameter) of the circuitry being monitored into a light signal representative thereof. The light signal is most commonly produced by an LED and is transmitted through a high dielectric strength, light-transmissive material, e.g., an air gap, fiber optic cable, etc., to a device, e.g., a photodetector, for converting the light received into an electrical output signal indicative thereof. The electrical output signal can then be provided to the monitoring circuitry for use thereby. An example of an LED-based opto-isolator is shown in U.S. Pat. No. 4,032,843 (Loucks).

While conventional LED-base opto-isolators are suitable for their intended purposes, they nevertheless leave much to be desired from the standpoint of electrical isolation (transparency) in high voltage applications. This is the direct result of the fact that conventional LED-based, opto-isolators require significant current, e.g., 10 milliamps, to produce sufficient light for reliable operation. Because of this characteristic if a LED-based, opto-isolation device is utilized in the monitoring of a high voltage circuit objectionable action could result. For example, if such an opto-isolator is connected in shunt with a limit switch in a high voltage circuit, e.g., a 480V boiler control circuit including the limit switch and a relay operated circuit breaker, to monitor the voltage across that switch when it opens, the flow of current through the opto-isolator's LED will result in an excessively large amount of power drawn, e.g., several watts. Moreover, depending upon how the boiler control circuit is arranged, the relatively high current, e.g., 10 milliamps, flowing through the opto-isolator could cause undesired operation of the circuit breaking relay after the event which triggered the opening of the limit switch.

The use of Neon or other glow-tube based opto-isolators has been disclosed in the following U.S. Pat. Nos.: 3,141,131 (McCoy), 3,991,367 (Chapman et al), 4,015,201 (Chaffee), and 4,188,574 (Allington).

OBJECTS OF THE INVENTION

Accordingly, it is a general object of this invention to provide a device which overcomes the disadvantages of the prior art.

It is a further object of this invention to provide an opto-isolated coupler and method of use in the monitoring of high voltage circuits.

It is still a further object of this invention to provide an opto-isolation coupler and method of use which ensures that very little current is drawn thereby in the interests of electrical transparency.

It is yet a further object of this invention to provide an opto-isolator device which is simple in construction and suitable for use in high voltage monitoring applications.

It is yet a further object of this invention to provide an integral opto-isolator device which is rugged in construction and insensitive to ambient light.

SUMMARY OF THE INVENTION

These and other objects of this invention are achieved by providing a coupling device for connection between first means having an electrical parameter to be monitored and second means for monitoring the parameter. The device comprises light output means for producing light upon the passage electrical current in the microamp range therethrough. Electrical resistance means having very high resistivity is provided connected to the light output means and coupled to the first means for providing electrical current in the microamp range to the light output means. The light responsive means is coupled to the second means and is arranged to provide an electrical signal in response to the receipt of light from the light output means. The device also comprises holding means comprising a pair of hollow portions and light transmissive means separating the hollow portions. The light transmissive means has a high dielectric strength. The light output means is disposed within one of the hollow portions adjacent the light transmissive means to direct its light therethrough to the other of the hollow portions. The light responsive means is disposed within the other of the hollow portions to receive the light from the light output means. Light isolation means are provide for preventing ambient light from reaching the light responsive means.

DESCRIPTION OF THE DRAWINGS

Other objects and many attendant features of this invention will become readily appreciated as the same becomes better understood by reference to the following detailed description when considered in connection with the accompanying drawings wherein.

DETAILED DESCRIPTION OF THE PREFERRED EMBODIMENTS

Figure 1:
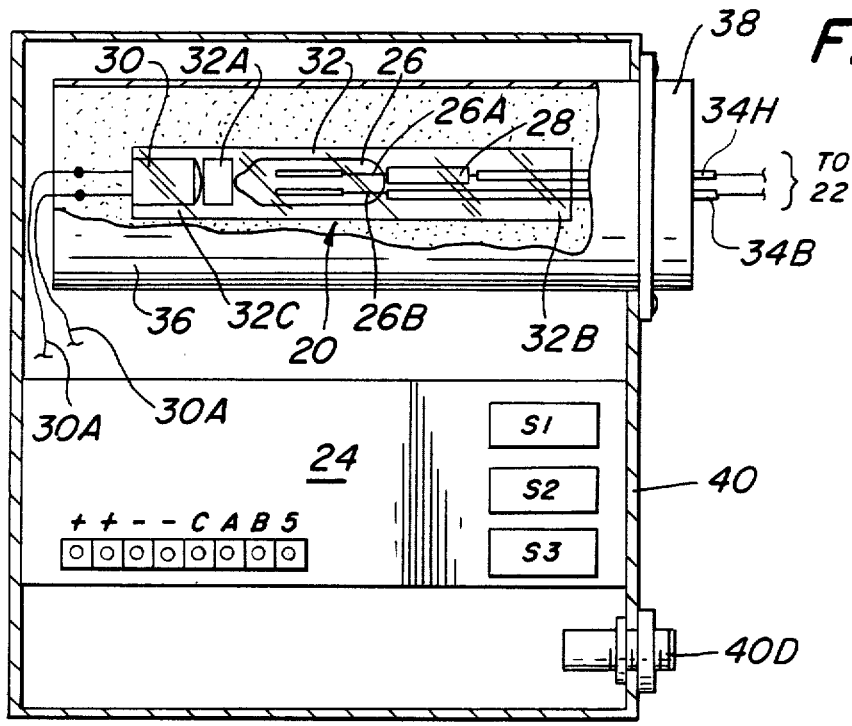
FIG. 1 is a perspective view, partially broken away, of a system for monitoring an electrical parameter of a circuit and incorporating the opto-isolation coupler of this invention.

Referring now to various figures of the drawing where like reference numerals refer to like parts there is shown at 20 in FIG. 1 one embodiment of an opto-isolation coupler constructed in accordance with this invention. The coupler 20 is arranged for electrical connection between an electrical circuit 22, e.g., a high voltage circuit, to be monitored, and monitoring circuitry 24, e.g., low voltage logic circuitry. The monitoring circuitry 24 is arranged for monitoring a parameter, e.g., line voltage, of the circuit 22. Unlike prior art opto-isolators, the opto-isolating coupler 20 of this invention is constructed to draw such negligible current from the circuit 22 so that it will not affect or alter the operation of circuit 22 (i.e., is virtually transparent). Thus, in the embodiments disclosed herein the amount of current drawn by the coupler 20 is in the microamp range, e.g., approximately 10 microamps. In order to use so little current the light source of the opto-isolator is a Neon or other glow tube lamp 26. As will be appreciated by those skilled in the art Neon or other glow tubes are capable of producing light with only microamps of current passing therethrough. In order to fire or illuminate a Neon or other glow tube a sufficiently high voltage, e.g., 60 volts, must be provided thereacross. Once that voltage is reached the tube turns on (strikes), whereupon it exhibits negative resistance.

Figure 2:
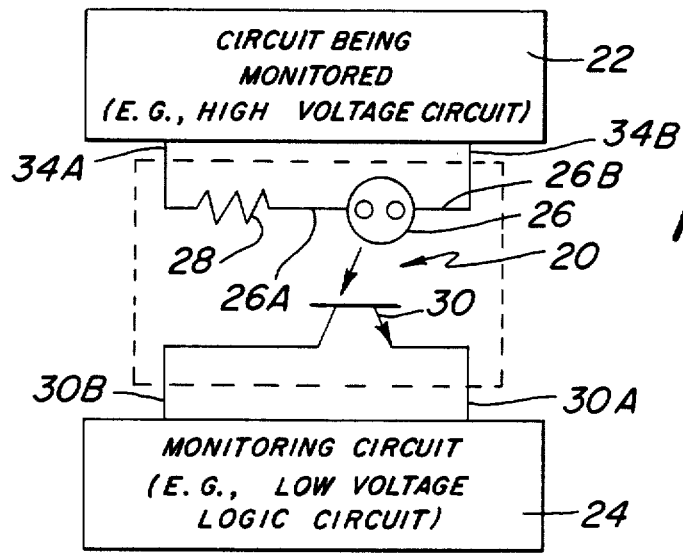
FIG. 2 is a schematic diagram of a portion of the device shown in FIG. 1 and showing the electrical details of the opto-isolation coupler of this invention.
Figure 3:
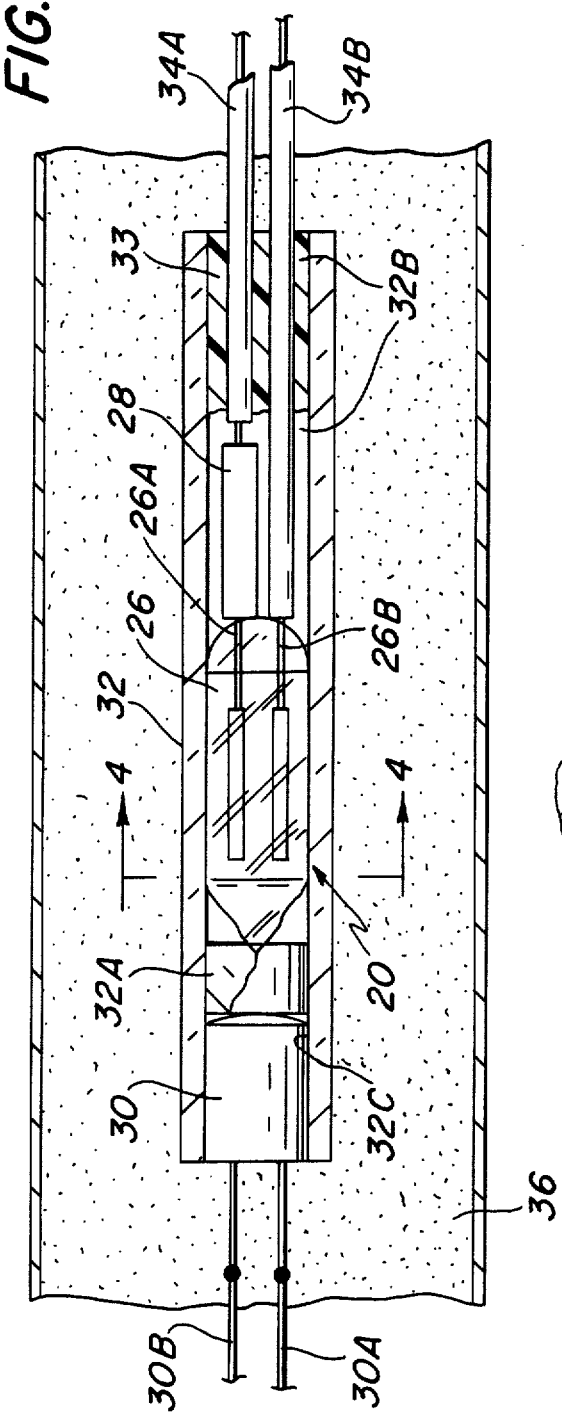
Figure 4:
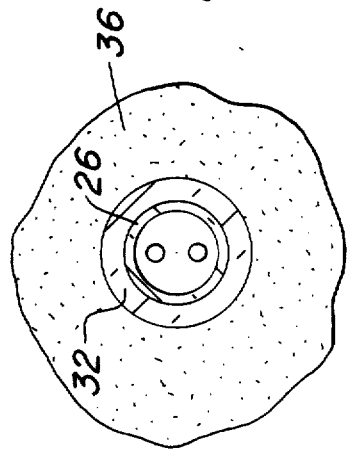

The subject opto-isolating coupler 20 basically comprises the heretofore identified Neon tube light source 26, high resistance means 28, and light responsive means 30, all housed within a holder 32. The high electrical resistance means 28 comprises a resistor connected in series with the Neon tube 26 to provide the very low current to the tube from the circuit 22. Thus, as shown clearly in FIGS. 1 and 2 one of the Neon tube's input leads 26A is connected to one side of the resistor 28. In a preferred embodiment of the coupler 20 the resistor 28 is of very high resistance, e.g., 3.9 megohms. The other side of the resistor 28 is connected to one input lead 34A of the opto-isolating coupler 20 . In the preferred embodiment the lead 34A is of sufficient gauge, e.g., 16 gauge, for connection to a high voltage, e.g, 110 to 480 volts, conductor (not shown) in circuit 22. The other lead 26B of the tube 26 is connected to another lead 34B. Lead 34B is of same gauge as lead 34A and serves as the other input lead of the opto-isolated coupler 20.

Since the coupler 20 is particularly suited for use in the monitoring of high voltage circuits, the resistor 28 is constructed to withstand very high voltages. Thus, in a preferred embodiment of the coupler 22 the resistor 28 is a metal oxide resistor. Other types resistors having high resistance values and capable of withstanding high voltages can be used in lieu of metal oxide resistors.

The light produced by the Neon tube 26 passes through a light transmissive, high dielectric strength medium, i.e., a glass barrier wall in the holder 32, for receipt by the light responsive means 30. The light responsive means includes a pair of output leads 30A and 30B, and is constructed and arranged so that it can provide a sufficiently high electrical output signal on those leads in response to very low levels of light received from the Neon tube 26. Thus, in the preferred embodiment of the coupler 20, the light responsive means comprises a Darlington pair phototransistor, such as an MRD360 sold by Motorola. As will be appreciated by those skilled in the art, the output signal provided by the phototransistor is proportional to the light received from the Neon tube. In order to prevent any ambient light from reaching the photodetector 32, where it could interfere with proper operation of the coupler, the coupler includes light isolating means (to be described later).

As can be seen clearly in FIG. 1 the holder 32 basically comprises an elongated tubular member having an intermediate barrier wall 32A interposed between a pair of hollow, open ended, chambers 32B and 32C. In the preferred embodiment of this invention the holder is formed as an integral unit of a light transparent, high dielectric strength material, e.g., Pyrex glass. Other materials can be used for the housing 34 so long as its barrier wall is light transmissive and of a high dielectric strength. In fact, the barrier wall need not be wall at all, but may be an air gap or some other transparent gas filled space.

The Neon tube 26 and the resistor 28 are disposed within the chamber 32B, with the Neon tube 26 being located immediately adjacent the barrier wall 32A so that the light produced thereby will pass through that wall to the chamber 32C. The phototransistor 30 is located within chamber 32C immediately adjacent the barrier wall 32A so that its light receiving portion will receive the light from the Neon tube 26. The components are secured within the chambers via an epoxy 33 or some other suitable means.

As mentioned earlier the coupler 20 includes light isolation means to prevent ambient light from reaching the photodetector. That means comprises any suitable potting material 36, such as a room temperature vulcanized (RTV) rubber, epoxy, etc., providing that the material is opaque (i.e., blocks ambient light). As can be seen in FIG. 1 the holder 32, with its components located therein, is encapsulated in the potting material 36. The potted coupler 20 is itself located within a conventional, small diameter, e.g., ¼ inch, threaded, metal nipple 38.

The nipple 38, with the coupler therein, is arranged for ready mounting in a monitoring circuit cabinet 40. The cabinet may be of any suitable construction. In the embodiment shown herein the cabinet includes an upper section 40A, in which the nipple with the coupler 20 therein is mounted, an intermediate section 40B, in which the monitoring circuit 24 is mounted, and a lower section 40C. The lower section serves to receive the various conductors to and from the monitoring circuit 24, e.g., conductors connected to monitoring circuit's sensors (not shown) and which pass through an access port 40D in the cabinet. The monitoring circuit itself is of any suitable construction, such as a printed circuit board 22A having various integrated circuit chips and other components (not shown) thereon. In addition the board 22A includes switches 22B and a terminal strip 22C either mounted thereon or connected thereto.

As should be appreciated from the foregoing the coupler 20 of this invention can be utilized with virtual electrical transparency in any system for monitoring an electrical parameter of a high voltage circuit. As will be appreciated by those skilled in the art, the use of the high dielectric material forming the interface between the neon tube and the phototransistor provided by the coupler of this invention serves to preclude adverse operation or damage to the low voltage/low current logic circuitry making up the monitoring circuit 24 from the high voltage of the circuit 22 being monitored. Moreover, the coupler when potted and located within the nipple is an integral, compact, rugged, and light insulated, unit, which can be readily mounted in various types of cabinets used in a wide variety of circuit monitoring/controlling applications.

Without further elaboration the foregoing will so fully illustrate my invention that others may, by applying current or future knowledge, readily adapt the same for use under various conditions of service.

I claim:

1. A coupling device for connection between first means providing a first high voltage digital electrical signal to be monitored and second means for monitoring said first signal, said second means operating at low voltage and/or low current levels, said device comprising light output means powered by said first electrical signal and for producing light upon the passage electrical current in the microamp range therethrough, said light output means comprising a neon tube, electrical resistance means having very high resistivity connected to said light output means and coupled to said first means for providing electrical current in said microamp range from said first electrical signal to said light output means to apply a voltage of at least a predetermined threshold across said neon tube to cause said neon tube to fire to provide output light, light responsive means coupled to said second means and being arranged to provide a second electrical signal in response to the receipt of said output light from said light output means, and holding means, said holding means comprising a pair of hollow portions and light transmissive means separating said hollow portions, said light transmissive means having a high dielectric strength, said light output means being disposed within one of said hollow portions adjacent said light transmissive means to direct its light therethrough to the other of said hollow portions, said light responsive means being disposed within said other of said hollow portions to receive said light from said light output means, and light isolation means for preventing ambient light from reaching said light responsive means said microamp current from said first means ensuring that said coupling device has virtually no effect on said first means, said high dielectric strength light transmissive means ensuring that the operation of said second means is not adversely affected by said high voltage of said first electrical signal.

2. The coupling of claim 1, wherein the resistance of said electrical resistance means is at least 3 megohms.

3. The coupling of claim 2 wherein said light isolation means comprises an opaque potting material encapsulating said holding means.

4. The coupling of claim 1 wherein said light isolation means comprises an opaque potting material encapsulating said holding means.

5. The coupling of claim 4 wherein said light transmissive means comprises a glass barrier wall.

6. The coupling of claim 1 wherein said light transmissive means comprises a glass barrier wall.

7. The coupling of claim 1 wherein said light responsive means comprises a phototransistor.

8. The coupling of claim 7 wherein said phototransistor comprises a Darlington pair.

9. The coupling of claim 8 wherein the resistance of said electrical resistance means is at least 3 megohms.

10. The coupling of claim 7 wherein said light isolation means comprises an opaque potting material encapsulating said holding, means, said phototransistor, and said Neon tube.

11. The coupling of claim 10 wherein said resistance means comprises a metal oxide resistor.

12. The coupling of claim 10 wherein said encapsulated coupling is located within a tubular nipple.

13. The coupling of claim 12 wherein said nipple is formed of metal.

14. A method of monitoring a first high voltage, digital signal of a first circuit by providing electrically isolated coupling means between said first circuit and monitoring means for monitoring said first signal and operating at low voltage and/or current, said coupling means comprising a neon tube, electrical resistance means having very high resistivity connected to said light output means, light responsive means providing an electrical signal in response to the receipt of light from said neon tube, and holding means, said holding means comprising a pair of hollow portions and light transmissive means interposed therebetween, said light output means being disposed within one of said hollow portions, said light responsive means being disposed within said other of said hollow portions, said light transmissive means having a high dielectric strength, said method comprising connecting said electrical resistance means to said first circuit and to said neon tube to provide electrical current in the microamp range to said neon tube whereupon a predetermined threshold voltage is attained across said neon tube to cause said neon tube to fire and produce output light, directing said output light through said light transmissive means for receipt by said light responsive means, preventing ambient light from reaching said light responsive means, and connecting said light responsive means to said monitoring means, whereupon said light responsive means provides said electrical signal to said monitoring means in response to the receipt of light from said light output means, with said microamp electrical current being sufficiently low to ensure that said coupling means has virtually no effect on said first means, said high dielectric strength light transmissive means ensuring that the operation of said monitoring means is not adversely affected by said high voltage first electric signal.

15. The method of claim 14 wherein said light transmissive means comprises a glass barrier wall.

16. The method of claim 15 wherein said housing, said light output means, said glass barrier wall, and said light responsive means are potted in an opaque material to prevent ambient light from reaching said light responsive means.

17. The method of claim 14 wherein said light responsive means comprises a phototransistor.

18. The method of claim 17 wherein said phototransistor comprises a Darlington pair.

19. The method of claim 14 wherein said electrical resistance means has a resistance of at least 3 megohms.

* * * * *